United States Patent [19]

Rougeolle et al.

[11] Patent Number: 4,503,453

[45] Date of Patent: Mar. 5, 1985

[54] DIGITAL METHOD AND DEVICE FOR CORRECTING THE PHASE ERROR OF A SAMPLED SIGNAL AS APPLICABLE TO THE CORRECTION OF TELEVISION SIGNALS

[75] Inventors: Daniel Rougeolle; Pascal Porrot, both of Paris, France

[73] Assignee: Thomson-CSF, Paris, France

[21] Appl. No.: 399,871

[22] Filed: Jul. 19, 1982

[30] Foreign Application Priority Data

Jul. 24, 1981 [FR] France ................. 81 14422

[51] Int. Cl.³ .............................................. H04N 9/32
[52] U.S. Cl. ....................................... 358/13; 358/339
[58] Field of Search ................. 358/13, 320, 324, 339; 340/347 SH; 375/95, 119

[56] References Cited

U.S. PATENT DOCUMENTS

| | | | |
|---|---|---|---|
| 4,122,487 | 10/1978 | Beaulier et al. | 358/13 |
| 4,301,466 | 11/1981 | Lemoine et al. | 358/13 |
| 4,349,833 | 9/1982 | Clarke | 358/13 |

Primary Examiner—Richard Murray
Attorney, Agent, or Firm—Cushman, Darby & Cushman

[57] ABSTRACT

At the time of analog-to-digital conversion by sampling of a sine-wave signal having a frequency F by means of a clock signal having a frequency 4nF where n is a whole number, these two signals exhibit a residual phase error $\Phi$. The method for correcting the converted digital signal according to the invention consists in delaying this signal by n periods of the clock signal in a shift register, in multiplying the undelayed signal by $\cos \Phi$, in multiplying the delayed signal by $\sin \Phi$ and in transmitting the results to an adder.

16 Claims, 8 Drawing Figures

DIGITAL METHOD AND DEVICE FOR CORRECTING THE PHASE ERROR OF A SAMPLED SIGNAL AS APPLICABLE TO THE CORRECTION OF TELEVISION SIGNALS

This invention relates to a digital method for correcting the phase error which affects a sine-wave signal of predetermined frequency at the time of conversion to a signal of the digital type. Conversion of the sine-wave signal consists in sampling this latter by means of a clock signal having a frequency which is a multiple of four of the predetermined frequency and in converting the samples thus obtained to a digital signal which is representative of their amplitude and of their polarity.

The invention also relates to a device for the practical application of said method.

In order to perform the analog-to-digital conversion operation mentioned above, it is a known practice to generate a clock signal which is preferably of the pulse type, thereby providing an accurate definition of the sampling instants, the recurrence frequency of which is a precise quadruple multiple of the frequency of the sine-wave signal. Said clock signal is usually controlled in dependence on the sine-wave signal and generated by means of a frequency multiplier device. A relationship of constant phase and of pre-established amplitude and sign must exist between the two signals in order to obtain accurate and faithful analog-to-digital conversion.

The condition just mentioned is never wholly satisfied and the residual phase error always remains in practice in spite of the different methods available for minimizing this residual error.

In certain applications in which the last-mentioned parameter is critical, the digital signal resulting from analog-to-digital conversion has to be corrected prior to use under all circumstances in order to take into account the residual phase error which is also liable to fluctuate in time, in amplitude and in sign.

The invention proposes to satisfy this requirement.

The present invention finds its principal application in the television field and more specifically in the field of recording and reading of television signals by means of equipment units such as television recorders or the like, the signals being composite signals which are coded in accordance with a method of the NTSC or PAL type.

It is known that, in these two systems, the composite television signal has two components: a video signal consisting of a signal representing the chrominance which produces amplitude modulation of a sine-wave signal or subcarrier signal to which is added a signal representing the luminance. The composite signal occupies a frequency band within the range of 5 to 6 MHz. Furthermore, the video signals are divided into time intervals representing a scanning line at the time of restoration of said signals on a visual display screen. This is achieved by transmitting at the beginning of each line a synchronizing pulse followed by a synchronization burst consisting of about ten periods of a sine-wave signal having the same frequency as the subcarrier.

The signal read on the recording medium of a video recorder cannot be directly mixed with signals produced by clock circuits. This may be the case, for example, of studio clock-signal generators employed in professional systems. This signal is in fact subjected to frequency modulation resulting in particular from the control circuits usually provided in this type of equipment and from the elastic nature of the material which constitutes the information recording medium such as a magnetic tape, for example.

Typically, the frequency deviation of the read subcarrier with respect to its nominal value can attain $10^{-3}$. At the maximum cumulative value, a frequency deviation of this order results in a period variation which may attain several microseconds. In the type of application under consideration, however, such residual errors must not usually exceed values of the order of 2 to 3 ns.

A known practice consists in performing a correction which will be designated hereinafter as a principal correction in order to cancel the cumulative error. To this end, it is customary to employ a buffer memory of the volatile random-access memory type having a capacity which is typically equal to three scanning lines.

It remains necessary to carry out a finer correction which will hereinafter be designated as a velocity correction for reducing the residual error at any moment of the time interval of scanning of one line to a lower value than that mentioned in the foregoing.

One of the objectives of the present invention in its application to the field of television consists in meeting these requirements.

The invention is therefore directed to a digital method of correction of the phase error with respect to a predetermined reference value introduced at the time of analog-to-digital conversion of a sine-wave signal having a predetermined frequency F to a sequence of first representative digital signals. Said conversion is performed by sampling the analog signal by means of a periodic clock signal having a frequency equal to 4nF, where n is a whole number which is greater than or equal to 1. The method according to the invention essentially comprises the following steps:

measurement of the phase-shift angle between the analog signal and the clock signal and computation of the phase error in respect of each period of the analog signal;

creation of a second sequence of digital signals by a displacement in time of said first digital signals, said displacement being equal to n periods of the periodic clock signal, where n is said whole number;

generation of a digital signal representing the value of the cosine and sine functions of the phase error;

multiplication of the first and second digital signals by the digital signals representing respectively the values of the cosine and sine functions of said phase error;

and addition of the results of said multiplications in order to generate a third digital signal, said third signal being equal to the first corrected signal of said phase error.

A further object of the invention is to provide a device for the practical application of the method outlined in the foregoing.

Finally, the invention is concerned with the application of said method and of said device to the phase-error correction of a composite television signal.

Other features of the invention will be more apparent upon consideration of the following description and accompanying drawings, wherein.

In the following specification, the elements which are common to two or more figures are designated by the same reference and will be described only once. In accordance with conventional practice, single-wire connections are shown as a single line and multiwire or bus connections are shown as a double line.

Figure 1:
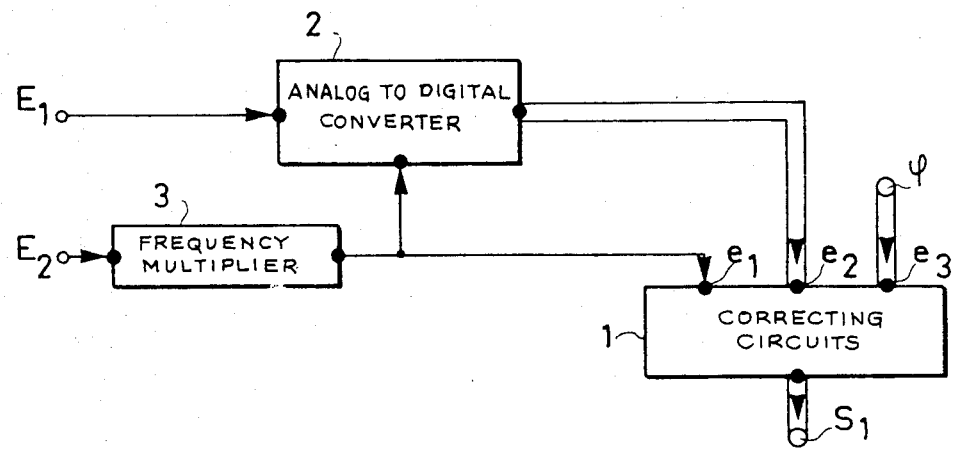
FIG. 1 is a schematic presentation of an analog-to-digital conversion system in which the device according to the invention can be utilized.

FIG. 1 is a schematic presentation of an analog-to-digital conversion system. The sine-wave signal $V_A$ which is to be converted and has a frequency F is applied to a series input $E_1$ of a converter 2. A sampling signal $V_{4nF}$ of the pulse type is applied to the clock input of said converter 2. The repetition frequency of said signal is chosen so as to be an integral multiple of four of the frequency of the signal F to be converted and the sampling operation takes place at one of the pulse transitions (at the leading edge, for example).

Figure 2:
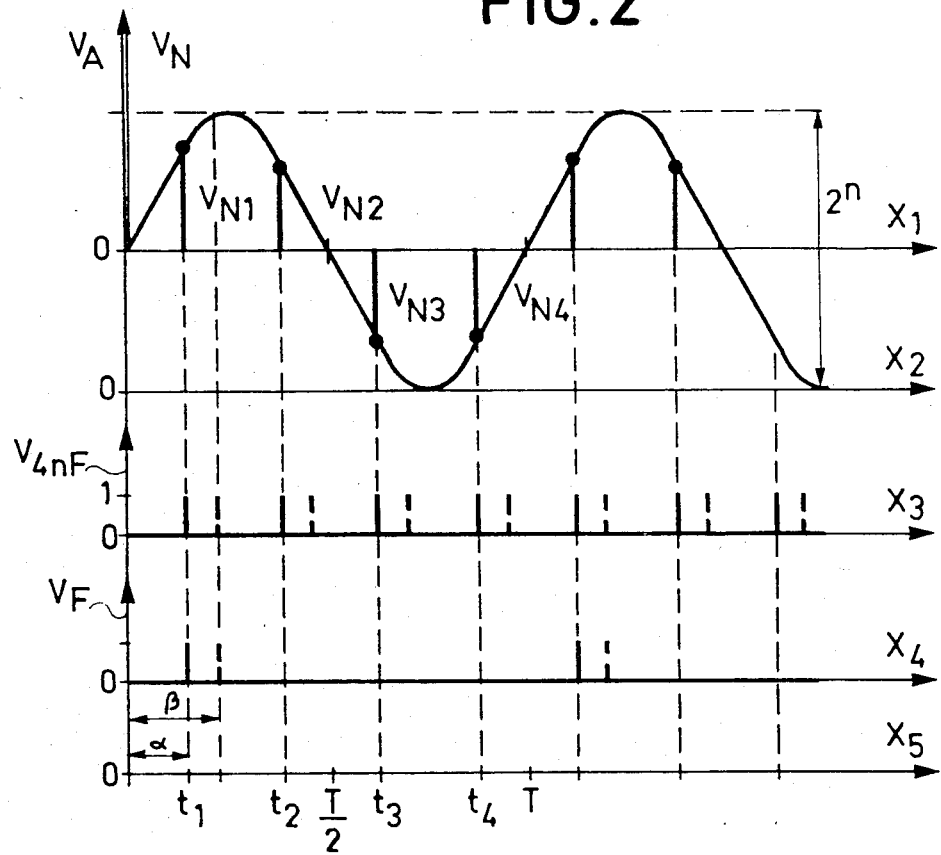
FIG. 2 is a diagram illustrating the operation of the system shown in FIG. 1.

The diagram of FIG. 2 illustrates the conversion process. The axis $OX_1$ represents the "analog zero" or in other words the mean value of the sine-wave signal $V_A$. The axis $OX_2$ represents the "digital zero" of the converted signal.

In a concrete example of construction, the analog-to-digital converter 2 has parallel outputs which deliver, for example, a 9-bit binary coded word and the highest-order bit represents the sign. The peak-to-peak amplitude of the sine-wave signal $V_A$ can be split-up into $2^m$ increments, the number of increments being 512 in the case of the example which has been chosen.

As is the customary practice, the sampling signal is derived from a signal $V_F$ which is present on the input $E_2$ having the same frequency F as the analog signal $V_A$, said signal $V_F$ being usually controlled in dependence on the analog signal $V_A$ by means which are not shown in FIG. 1. To this end, a frequency multiplier 3 of known type is employed. To help fix ideas and to simplify the representation of the signals, it will be postulated that "n" has a value equal to 1. The pulses constituting the respective signals $V_{4nF}$ and $V_F$ are represented by full lines on the axes $OX_3$ and $OX_4$.

The phase shift of the signal $V_F$ with respect to the analog signal $V_A$ is equal to $\alpha$ as represented on the time axis.

Sampling takes place at the instants $t_1$, $t_2$, $t_3$ and $t_4$ (within a period T of the analog signal) and successive 9-bit words representing the amplitude of the samples $V_{N1}$ to $V_{N4}$ are available at the parallel outputs of the analog-to-digital converter 2 after the sampling instants.

In many applications, the phase shift between the sine-wave signal to be converted and the sampling signal must be constant and equal to a pre-established value which is defined both in amplitude and in sign. This value will hereinafter be designated as the reference value $\beta$.

In actual fact, and as shown in the diagram of FIG. 2, the real phase shift $\alpha$ differs from the reference value $\beta$ which would be obtained by means of the sampling signals represented in dashed lines.

There are many methods in existence for minimizing the difference between $\alpha$ and $\beta$ which will hereinafter be referred-to as the residual phase error $\Phi$, where $\Phi$ is given by the relation: $\Phi = \beta - \alpha$. In many applications, examples of which will be described below with reference to FIGS. 4 to 8, the residual phase error $\Phi$ nevertheless remains too great.

The general aim of the invention is to provide a method for correcting this residual error $\Phi$. A device for carrying out the method as represented schematically in FIG. 1 by the correcting circuits 1 will now be described. These circuits deliver at their parallel outputs $S_1$ a digital signal $V'_N$ representing the digital signal $V_N$ after correction. To this end, the correcting circuits 1 receive the sampling signal $V_{4nF}$ on a first input $e_1$, the digital signal delivered by the analog-to-digital converter 2 on a second multiple input $e_2$, and data in the form of a binary word representing the residual phase error $\Phi$ on a third input $e_3$.

Figure 3:
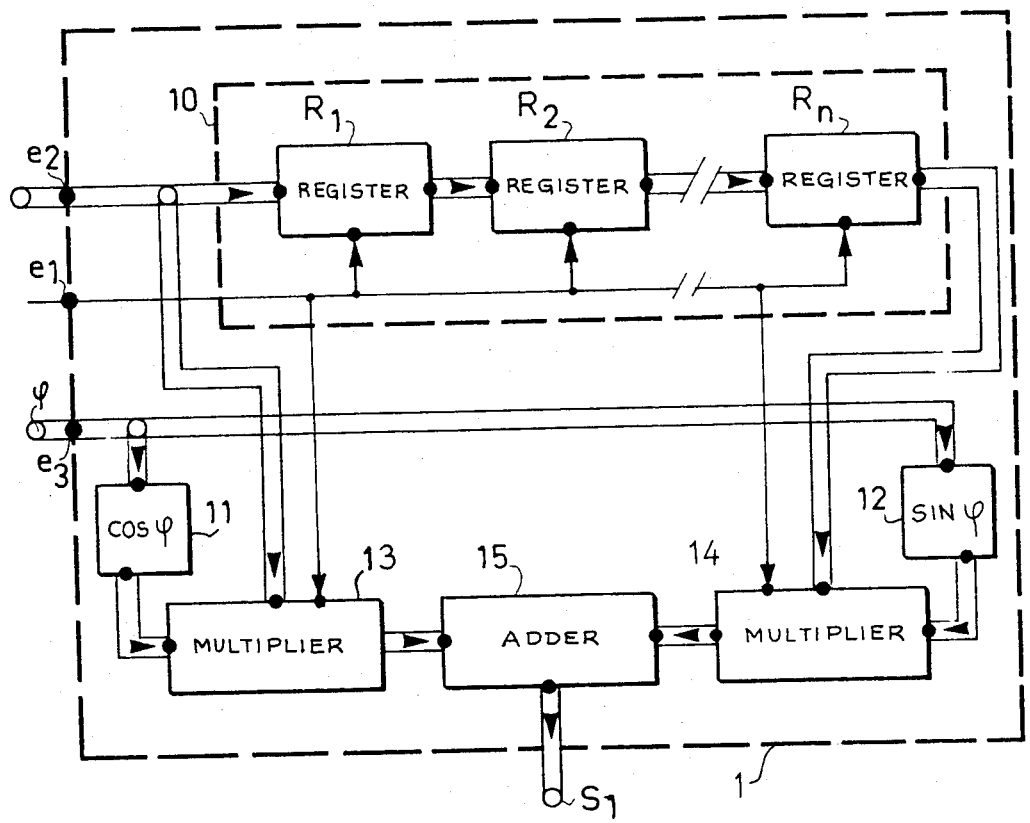
FIG. 3 is a more detailed diagram of the device according to the invention.

FIG. 3 is a more detailed representation of the correcting circuits 1. These circuits consist of a module 10 which comprises a number n of cascade registers $R_1$ and $R_n$ having parallel inputs and outputs. Each register can be constituted by D-type bistable devices, the number of which is equal to the number of bits of the binary word produced by the analog-to-digital converter 2. The clock input with which this type of bistable device is provided receives the sampling signal which is transmitted to the input $e_1$ of the correcting circuits 1 and has a frequency 4nF.

It may prove useful to recall the configuration of this type of bistable device. The device as well as the truth table and its time diagram can be found among other publications in the book entitled "De La Logique Cablée Aux Microprocesseurs" ("From wired logic to microprocessors") by Bernard et alia, in Volume 1, chapter X.4, pages 136–138 (published by Editions Eyrolles, Paris, 1979).

A bistable device of this type has a data input, a clock input, a preset input, a clear input and two outputs consisting respectively of a true output and an inverted output. The preset and clear inputs are asynchronous and restore the bistable device to "1" or "0" respectively and independently of the clock signals. The synchronous mode selected within the scope of the present Application is defined by the data input and the clock input. The bistable device recopies the data input after the appearance of a leading edge of the clock signal applied to the clock input, that is to say of the pulses of the sampling signal $V_{4nF}$.

The binary word at the output of the bistable devices of the register $R_n$ is therefore delayed by n clock pulses.

The amplitude of a sample at any given instant t represented by a binary word on the multiple input $e_2$ is equal to: $A \sin[2\pi F t + \beta]$, where A is a coefficient which is proportional to the amplitude of the analog signal $V_A$.

The binary word on the outputs of the register $R_n$ is written:

$$A \sin\left[2\pi F\left(\frac{t-n}{4nF}\right) + \beta\right], \text{ or else } -A\cos[2\pi Ft + \beta]$$

The binary words at the inputs and outputs of the module 10 are transmitted respectively to a first series of inputs of a first digital multiplier 13 and of a second digital multiplier 14. These multipliers receive on a second series of inputs first and second binary words representing the cosine function $\Phi$ in the case of the first word and the sine function $\Phi$ in the case of the second word. These functions can be generated by any suitable means such as a function generator, stored tables, and so on. In a preferred alternative embodiment shown in FIG. 3, two semiconductor memories 11 and 12 of the programmable read-only type (PROM) are employed for producing the "cos $\Phi$" and "sin $\Phi$" functions. Said memories 11 and 12 are addressed by the binary word representing the residual phase error $\Phi$. Each addressed memory position is recorded and one binary word represents the value: cosine $\Phi$ (memory 11) or sine $\Phi$ (memory 12) which is sought. These binary words at the outputs of the multipliers 13 and 14 are transmitted to a binary adder 15. The multiplication operations take place at the frequency of the clock signal $V_{4nF}$. To this end, said signal is transmitted to a clock input which is provided in this type of circuit.

The binary word at the output of the multiplier 13 represents the value: $A \sin(2\pi Ft + \beta) \cos \Phi$ and the binary word at the output of the multiplier 14 represents the value:

$$A \sin\left[2\pi\left(\frac{t-n}{4nF}\right) + \beta\right] \sin' \Phi,$$

that is: $-A \cos(2\pi Ft + \beta) \sin \Phi$. It accordingly follows that the binary word at the output $S_1$ of the adder 15 is written $A \sin(2\pi Ft + \alpha)$ and this signal is entirely free from the residual phase error $\Phi$ produced by the analog-to-digital conversion process.

The correcting circuits as shown in FIGS. 1 and 3 and constituting the device which forms the main object of the invention can be constructed by means of commercially available elements or by means of discrete wiring elements. There have not been shown in this figure either the voltage supply circuits or the circuits for transmitting service signals and internal clock signals which are essentially dependent on a technological choice and are within the capacity of anyone versed in the art.

By way of illustration, the analog-to-digital converter 2 can be of the type designated as DTC 1019 and the multipliers 13 and 14 can be of the type designated as MPY8HJ and marketed by the company known as TRW. The registers $R_1$ to $R_n$ can be constructed from integrated circuits of the type designated as 74LS374 and the adder 15 can be constructed from integrated circuits of the type designated as 74LS283 and marketed by the company known as Texas Instruments.

The memories 11 and 12 are PROM memories of the type HM 76161-5 having a capacity of $8 \times 2K$ bits and marketed by the Harris Company.

The information which provides the residual phase error $\phi$ can be obtained by any suitable means of the prior art and is within the capacity of anyone versed in the art. The method for measuring the residual phase error $\phi$ does not come within the scope of the present invention. It may prove useful, however, to provide a brief description of a method which makes it possible to carry out this measurement with high speed and accuracy and is particularly suited to the present invention.

In accordance with this method, the analog signal to be converted is sampled in a manner which is analogous to the method described with reference to the diagram of FIG. 2 by means of a signal having a frequency which is four times the frequency of the analog signal $V_A$. Within the scope of the example chosen, the analog-to-digital converter delivers a 9-bit binary word and the highest-order bit represents the sign of the sample. There are therefore 512 possible digital levels.

The reference sample $V_{N1}$ which represents $\sin \alpha$ and the sample V which represents $\cos \alpha$ or, when $\beta$ is known, $\sin \phi$ and $\cos \phi$, are utilized within one period. To this end, when the numerical value of the sample is greater than 256 (positive arch of the sine-wave), said numerical value is employed directly for computation of the two functions. On the other hand, when said numerical value is between 0 and 256 (negative arch), the numerical value provided by the converter is twos-complemented. Discrimination takes place by examination of the $2^8$ bit representing the sign. In actual fact, the sampled values represent respectively $A \sin \Phi$ and $A \cos \Phi$, where A is the maximum amplitude of the analog signal. In order to eliminate the coefficient A, the following operation consists in computing tg $\Phi$ or cotg $\Phi$, according as $|A \sin \Phi|$ is smaller than or greater than $|A \cos \Phi|$. To this end, a comparison is made between the two last-mentioned values.

In accordance with this method, the absolute values of tg $\Phi$ and cotg $\Phi$ are calculated as follows:

$$|tg \; \Phi| = A |\sin \Phi| \times (1/A |\cos \Phi|)$$

and $$|cotg \; \Phi| = A |\cos \Phi| \times (1/A |\sin \Phi|)$$

The inversion of the functions $A |\cos \Phi|$ and $|A \sin \Phi|$ can be carried out by means of memories of the PROM type which are similar to those employed in the device described with reference to FIG. 3 and which are addressed by the binary words representing $|A \cos \Phi|$ and $|A \sin \Phi|$.

As recalled earlier, depending on the result of the comparison between the values $|A \sin \Phi|$ and $|A \cos \Phi|$, the angle $\Phi$ is calculated respectively from tg $\Phi$ or cotg $\Phi$ in a last step of the method. In order to carry out this calculation, it is also possible to make use of a PROM-type memory which is addressed by the binary word representing tg $\Phi$ or cotg $\Phi$ and delivers a binary word on its output representing the residual phase error $\Phi$ which it is sought to determine.

By means of this method, the measurement of $\Phi$ is independent of the amplitude of the sine-wave signal and the degree of accuracy obtained depends solely on the number of bits delivered by the analog-to-digital converter. In the example chosen, the accuracy achieved with 9 bits is greater than 1°. Finally, the data which are necessary for calculation of $\Phi$ and which essentially consist of the samples $V_{N1}$ and $V_{N2}$ are directly available within the scope of the present invention.

The method of the invention as hereinabove described has a wide range of potential applications, especially in the field of television, for phase error correction at the time of sampling of signals utilized in simultaneous color television systems such as NTSC, PAL or the like. As recalled earlier, the composite PAL or NTSC television signal is constituted by a videofrequency signal comprising a signal representing the chrominance which produces amplitude modulation of a subcarrier sine-wave signal at a fixed frequency $F_{sC}$ to which is added a signal representing the luminance.

In the case of the NTSC system, the frequency of the subcarrier signal is equal to: $F_{sc} = 455/2 \times Fl$, where $Fl$ is the repetition frequency of a scanning line at the time of restitution of videofrequency information on a visual display screen.

The chrominance signal can also be split-up into two components I and Q which produce amplitude modulation of two subcarriers having a frequency $F_{sC}$ and in quadrature, namely: $I \sin(2\pi F_{sc} t) + Q \sin(2\pi F_{sc} t + 2)$ or else: $I^2 + Q^2 \sin(2\pi F_{sc} t + \gamma)$, with $\tg \gamma = Q/I$.

This is a sine-wave signal whose amplitude is characteristic of the saturation and phase of the hue. It has also been recalled that a burst of sine-wave signals is transmitted among others at the frequency of the subcarrier $F_{sC}$ at the beginning of each scanning line.

In the case of the PAL system, the frequency of the subcarrier signal is equal to: $F_{sc} = (1135/4)F_l + 25$ Hz. The chrominance is constituted by two components: U and V.

The first component U produces amplitude modulation of a subcarrier signal at the frequency $F_{sC}$ and the second component V produces phase modulation of a second subcarrier signal having the same frequency, at $+\pi/2$ radians from one scanning line to the next. The resultant signal is given by the relation:

$$V \sin(2\pi F_{sc} t) + V \sin(2\pi F_{sc} t \pm \pi/2).$$

This also constitutes a sine-wave signal whose amplitude is characteristic of the saturation and phase of the hue.

It is customary practice, especially for the recording of video signals, to digitize these signals at the time of reading in order to make corrections by means of digital methods. In this field of application, the same difficulties as those mentioned earlier are again encountered, that is, sampling of the composite signal with a residual phase error $\Phi$. Since the composite signals are of the type which has just been recalled, they can be converted in much the same manner as that described with reference to FIGS. 1 and 2. Known methods make it possible to minimize the residual phase error at a typical value of 11° (approximately 0.2 radian), thus constituting an unacceptable level of error in the application under consideration, especially in regard to the chrominance. The method according to the invention can therefore be profitably utilized and, if it does not achieve complete nullification of the phase error, this latter is reduced to a value which is typically lower than 1° ($17 \times 10^{-3}$ radians).

Figure 4:
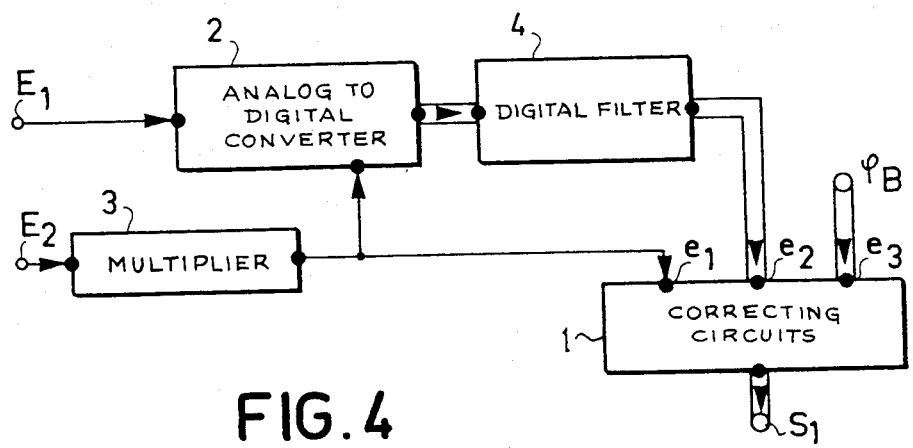
FIG. 4 illustrates the application of the device according to the invention to the correction of the signal representing the chrominance in a composite television signal.

The schematic diagram of FIG. 4 illustrates the application of the method according to the invention to the correction of the phase error which appears at the time of sampling of the chrominance signal. The same references will serve to designate the elements which have already been described with reference to the system of FIG. 1 and which will not be described further. The signal to be converted is the composite signal transmitted to the input terminal $E_1$. A pulse signal having a frequency equal to the subcarrier frequency is transmitted to the input terminal $E_2$ and converted by the multiplier 3 to a sampling signal which, for the sake of illustration of the method, will be assumed to be equal to four times the frequency of the input signal (postulating that $n=1$).

The system differs from the system shown in FIG. 1 in the fact that the signal representing the chrominance component is first extracted from the digital signal before being transmitted to the correcting circuits 1 which are identical with those of FIGS. 1 and 3. A digital filter 4 of any known type such as a transversal filter, for example, is employed for this purpose. The residual phase error $\Phi_B$ transmitted to the input $e_3$ of the correcting circuits is measured on the burst signals transmitted at the beginning of a scanning line. Any method of phase measurement can be employed and especially the method described earlier. There is therefore available on the output $S_1$ a corrected digital signal which represents the chrominance.

The device described in the foregoing can be utilized in particular in a video recorder and in particular a professional video recorder of the type which is used in a recording studio.

In the introductory part of the present description, it was recalled that the signals read on a recording tape could not be mixed directly with other stable sources.

In this field of applications, apart from the principal correction which permits cancellation of the cumulative error in accordance with conventional methods, it is necessary to perform a second correction known as a velocity correction.

With this objective, the method according to the invention can also be profitably applied by means of the system described with reference to FIG. 4. However, a single measurement of the phase error per scanning line is not sufficient to obtain the desired result. This error varies throughout the time interval of a scanning line. It is not feasible in practice, however, to contemplate continuous measurement of this variation.

According to an additional aspect of the invention, measurement of the residual phase error will be computed at a certain number of points of a scanning line by interpolation on the variations in values of residual phase errors which are really measured from one line to the next.

Figure 5:
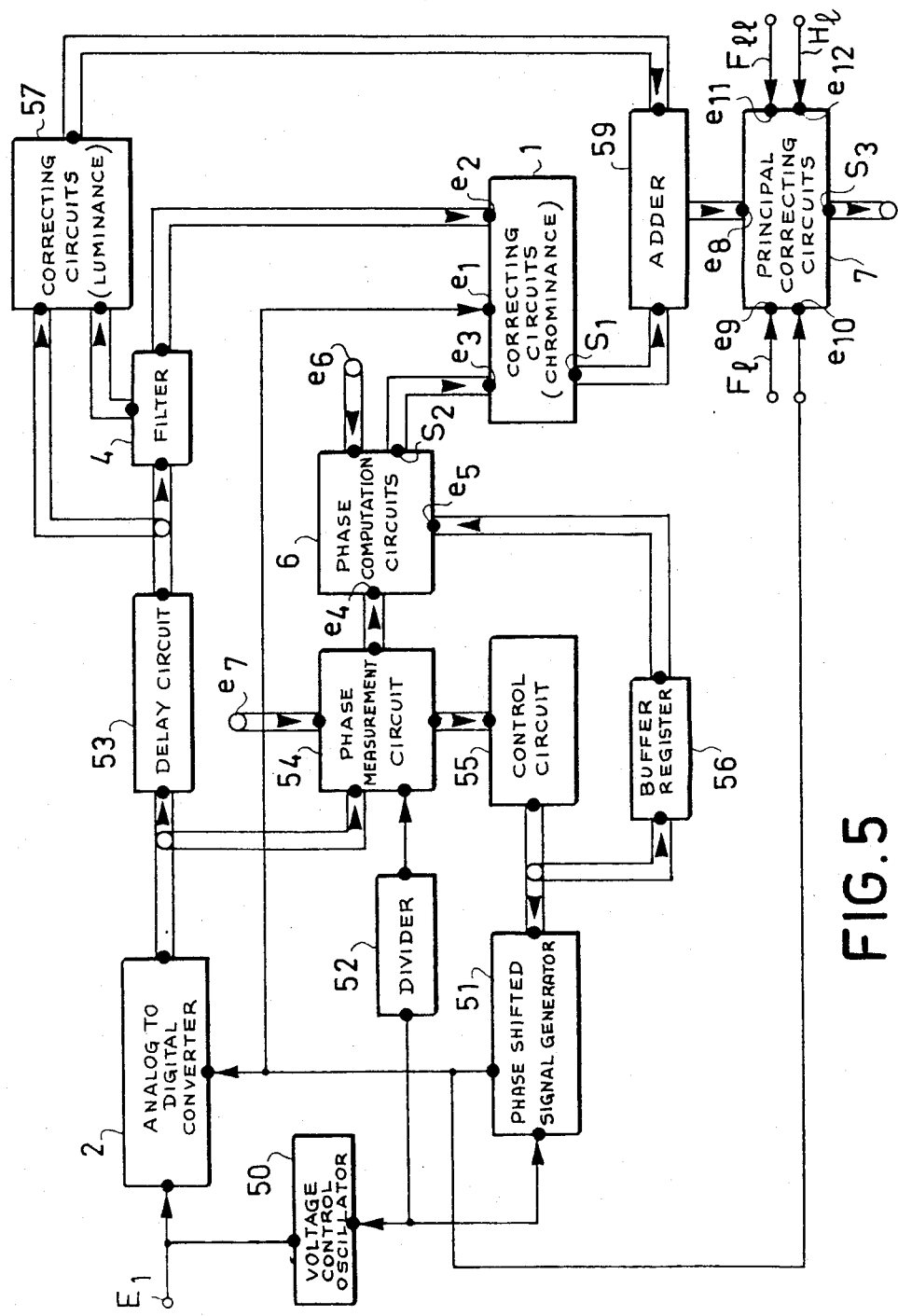
FIG. 5 illustrates the application of the device according to the invention to a time-base correcting system in a video recorder.

FIG. 5 is a schematic diagram showing the main elements of a video recorder time base, consideration being given solely to those elements which are necessary in order to gain a clear understanding of this application. As was the case earlier, the composite signal is transmitted to the input terminal $E_1$ and converted to a digital signal by the analog-to-digital converter 2. The sampling signal is generated from the composite signal, for example by means of a voltage-controlled oscillator (VCO). The signal at the output of said oscillator is a pulse signal having a frequency $4F_{sc}$, where $F_{sc}$ is the subcarrier frequency.

The time base further comprises a device for minimizing the residual phase error $\Phi$. Although this device does not come within the scope of the invention, it may nevertheless prove useful to provide a brief description of its operating principles.

A phase measurement circuit 54 of the type, for example, which utilizes the method described in the foregoing, serves to measure the residual phase on the burst of signals having a frequency $F_{sc}$. Said circuit receives a signal at the same frequency on a clock input. To this end, a scale-of-four divider 52, a binary counter having a capacity of four, for example, is interposed between the voltage-controlled oscillator 50 and the clock input of the phase measurement circuit 54. This circuit also receives different service signals which make it possible in particular to define a time window for phase measurement on a multiple input $e_7$.

Figure 8:
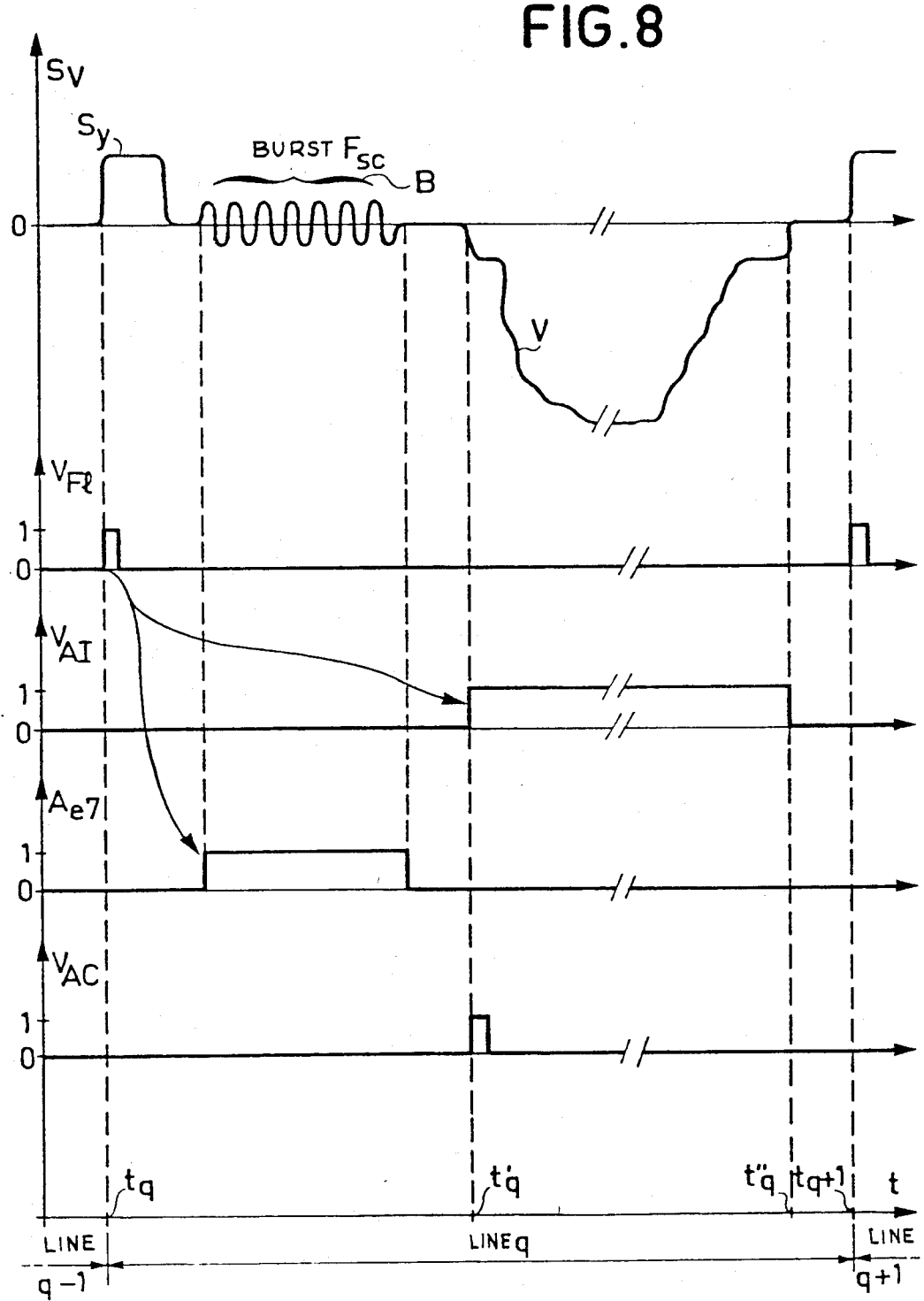
FIG. 8 is a diagram which is more particularly intended to illustrate the operation of the computing circuit of FIG. 6.

Referring now to the diagram of FIG. 8, a composite signal $S_V$ of the conventional NTSC type is represented at the top of the diagram. At the beginning of the scanning line, that is, the line of order q in the diagram of FIG. 8, said composite signal comprises a synchronizing pulse $S_y$ followed by the burst of sine-waves B having a frequency $F_{sc}$. The zero on the vertical axis represents the so-called suppression level and also the mean value of sine-waves of the burst B. It is therefore an easy matter to derive a pulse signal $V_{F1}$ at the line repetition frequency in order to define the beginning of a line at the instant $t_q$ on the time axis t. A permission window $A_{e7}$ can in turn be derived from said pulse for measuring the phase of the burst B when the local government regulations governing the television standard employed are known.

The phase measurement circuit 54 also receives on the input busbar $e_7$ a binary word representing the reference value of the phase $\beta$ to be followed. By making use of the measured value $\alpha$ and of the value $\beta$ aforesaid, the measurement circuit produces the value of the residual error $\Phi$ in the form of a binary word transmitted to a control circuit 55 comprising, for example, a PROM-type memory which is addressed by the binary word representing $\Phi$ and produces a control word which is transmitted to a phase-shifted signal generator 51. The design function of this generator is to produce from the output signal of the oscillator 50 a series of pulse signals having the same repetition frequency ($4f_{sc}$) as that of the oscillator output signal, the different signals of the series being phase-shifted with respect to each other with the same increment. The generator 51 aforesaid comprises a multiplexing circuit controlled by the binary word produced by the control circuit 55 in order to select one of said signals of the series. This signal is alone transmitted to the sampling input of the analog-to-digital converter 2 so as to minimize the residual phase error $\Phi$ by virtue of a suitable choice of the sampling signal which gives rise to the minimum error.

It is assumed that the measurement is carried out at the beginning of the scanning line of order $(q-1)$. The phase shift after correction by this method will hereinafter be designated as $\alpha_1$ and more generally as $\alpha_1{}^{q-1}$ in order to take the instant of measurement into account. This value $\alpha_1{}^{q-1}$ is recorded in a buffer register 56 throughout the duration of a time interval of one scanning line and is restored to the following scanning line on the output of said register. To this end, reading and writing permission signals (not shown in the drawings) serve to produce this sequencing operation. Said signals can also be derived simply from the signal $V_{F1}$ described earlier.

The digital signal at the output of the analog-to-digital converter is also delayed by means of a delay circuit 53. Said circuit can be constituted by shift registers having parallel inputs and outputs and a time interval T equal to one scanning line. The output of said circuit is connected to the input of the filter 4 which has been described with reference to FIG. 4 and the intended function of which is to extract the chrominance signal transmitted to the input $e_2$ of the correcting circuits 1. As in the previous instance, these circuits receive the sampling signal on the input $e_1$.

In the application herein described, it is necessary to acquire at each instant of the time interval of a scanning line information relating to the phase error produced by conversion to the chrominance signal. To this end, a phase computation circuit 6 receives at the beginning of each scanning line the value of the residual phase shift $\alpha_1{}^{q-1}$ which is available at the output of the buffer register 56 and produced at the line $(q-1)$. Said phase computation circuit also receives from the phase measurement circuit 54 the value which is measured at the beginning of a line of order q and which will be designated as $\alpha_2{}^q$. This value also represents with a good degree of approximation the value of phase shift at the end of a scanning line of order $(q-1)$. The function of the phase computation circuits 6 is to compute by interpolation at a large number of points of the time interval of a scanning line the instantaneous residual phase error $\Phi$ on the basis of computation of $|\alpha_2{}^q - \alpha_1{}^{q-1}|$ representing two data which are present on the respective inputs $e_4$ and $e_5$. The phase computation circuits will be described in detail hereinafter with reference to FIG. 6. The residual phase error $\Phi$ which is available on the output $S_2$ is transmitted to the input $e_3$ of the correcting circuits 1, thus producing by means of the input data a corrected chrominance signal which is available on the output $S_1$.

In order to complete the description of the system of FIG. 5, it should be mentioned that the correcting circuits 57 extract the luminance signal from the digital signal at the output of the delay circuit 53 and correct the signal by means of a method which is not relevant to the present invention. This correction stage may be omitted in some applications, however, since the phase errors in the luminance signal are less critical than those arising from the chrominance signal at the time of sampling. The corrected composite signal is then reconstituted by addition within the digital adder 58 and transmitted to conventional principal correcting circuits 7. It may nevertheless prove useful to recall the operation of said correcting circuits.

These circuits 7 essentially comprise a random access memory having a typical capacity equal to three scanning lines. The signal which is velocity-corrected by the method described in the foregoing is transmitted to the data input $e_8$ of the memory and writes at addresses generated by a first address counter. A line-synchronizing signal $F_1$ which is read from the non-corrected video signal is applied on the one hand to the input $e_9$ of said counter. A clock signal in the form of the sampling signal is applied on the other hand to the input $e_{10}$ of said counter. The first signal $F_1$ can be derived from the signal $V_{F1}$ shown in FIG. 8.

The signals thus recorded in the memory of the principal-correction circuits 7 are then read by means of stable signals generated locally by circuits which are external to the video recorder (but are not shown in FIG. 5). These signals consist on the one hand of a line-synchronizing signal $F_{11}$ on the input $e_{11}$ and of a clock signal $H_1$ on the input $e_{12}$ at the frequency $4F_{sc}$. The memory of the circuits 7 performs the function of a buffer memory and the cumulative error is suppressed by means of this method. The signal available at the output $S_3$ of the principal-correction circuits is therefore corrected for both types of errors, namely velocity and cumulative error.

Figure 6:
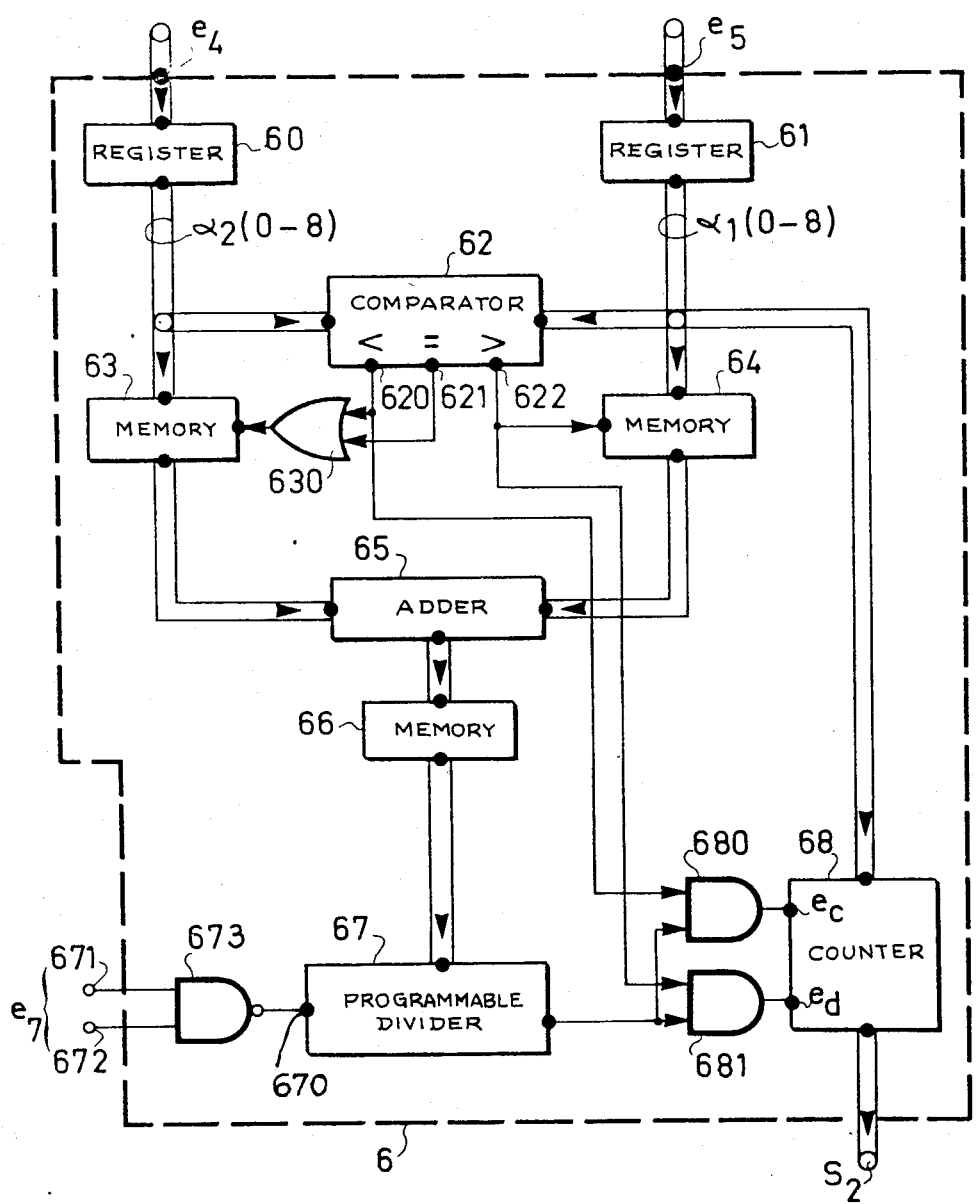
FIG. 6 is a more detailed diagram showing a phase-computing circuit employed in the time-base correcting system aforesaid.

The phase computation circuits 6 are shown in greater detail in FIG. 6.

The values $\alpha_1{}^q$ and $\alpha_2{}^{q-1}$ are recorded respectively in the registers 61 and 60 which have a capacity of 9 bits. In order to simplify the description of the device, the connections for the supply of voltage to the different circuits as well as the service signals and internal clock signals are not shown in the figure since they are related to the technological choice made at the time of actual construction of these circuits. The registers have a capacity of 9 bits in the case of the example under consideration.

Point-by-point computation of the residual phase error is performed in the manner which will now be described below. The value $\alpha_1{}^{q-1}$ or residual phase shift initializes at each start of a scanning line a counter 68 which can be either incremented or decremented by control signals having two logical states which are transmitted respectively to an incrementation input $e_c$ and to a decrementation input $e_d$. Incrementations or decrementations take place at each pulse of a clock signal generated by a programmable divider 67. The state of loading of said divider depends on the difference $|\alpha_2{}^{q-1} - \alpha_1{}^q|$. The function of said divider is to ensure the best possible distribution of the successive incrementations or decrementations of the counter 68 within the time interval T of one scanning line. In the case of each clock pulse, said counter 68 must deliver at the output $S_2$ a binary word of intermediate value between $\alpha_2{}^{q-1}$ and $\alpha_2{}^q$. The maximum capacity of the programmable divider 67 determines the accuracy of interpolation. A typical value is 512 which is the maximum permitted by a 9-bit word. There is therefore a possibility of producing a number of clock pulses within the range of 0 to 512, depending on the load binary word. These clock pulses which have optimum distribution within the time interval T of one scanning line are transmitted to one of the input terminals of two logical AND-gates 680 and 681, the outputs of which are connected respectively to the incrementation and decrementation inputs $e_c$ and $e_d$ of the counter 68.

The programmable divider receives on a clock input 670 clock signals having a frequency which is determined by the capacity of the divider, that is to say the maximum number of points of computation of the phase error (512 in the example chosen) and by the reciprocal of the time-duration of the video signal (which depends on the system chosen, namely PAL, NTSC, and so on). The clock signal can be produced by any conventional oscillator (not shown in the figure). Said signal is transmitted to the circuits 6 via one of the lines 671 which constitute the multiple input $e_7$.

Effective transmission of said clock signal is permitted only within a time window corresponding to the duration of the video signal proper. With this objective, a logical NAND-gate 673 is employed. The clock signal is applied to one input of said gate and a computation permission signal is applied to the other input.

Referring again to FIG. 8, the successive computations of residual phase errors $\Phi$ must take place during the time interval $t'_q$ to $t''_q$ which is the effective time-duration of the video signal V and especially of the chrominance signal which has to be corrected. In order to achieve this result, an interpolation-permission logical signal $V_{AI}$ is generated. When the regulations governing the standard employed are known, said logical signal may be derived simply from the signal $V_{F1}$ described earlier. The permission signal $V_{AI}$ is transmitted via the connection 672.

It must be clearly understood that the corrections to be made during the time interval $t'_q - t''_q$ do not relate to the chrominance signal of the scanning line of order q but relate to the chrominance signal of the line of order (q−1) which is transmitted to the correcting circuits 1 during said time interval by the delay circuit 53 (as shown in FIG. 5). The correction on the chrominance signal of the scanning line of order q will take place at the scanning line of order q+1.

Before transmitting a loading item of information to the programmable divider, it is necessary to determine the sign of the difference $\alpha_2{}^{q-1} - \alpha_1{}^q$. To this end, the two signals $\alpha_2{}^{q-1}$ and $\alpha_1{}^q$ are transmitted to a binary comparator 62. By virtue of the presence of a logical "1", the outputs 620, 621 and 622 indicate respectively $|\alpha_2{}^{q-1}| < |\alpha_1{}^q|$, $|\alpha_2{}^{q-1}| = |\alpha_1{}^q|$ and $|\alpha_2{}^{q-1}| > |\alpha_1{}^q|$. The signals on the outputs 620 and 621 are transmitted respectively to the second inputs of the logical AND-gates 680 and 681 for controlling incrementation and decrementation of the counter 68. This counter has the same capacity as the programmable divider 67.

When $|\alpha_2{}^{q-1}|$ is lower than or equal to $|\alpha_1{}^q|$, the twos complement of the value $|\alpha_2{}^{q-1}|$ is employed for the computation. To this end, it is possible to make use of a PROM-type memory 63 in which are recorded the true values and the twos complements of the value $|\alpha_2{}^{q-1}|$. The memory is addressed by the binary word at the output of the register 60; depending on the value of an additional address bit transmitted by an OR-gate 630 which receives on two inputs the bits transmitted by the outputs 620 and 621, the true value $|\alpha_2{}^{q-1}|$ or its twos complement is available on the output of the memory 63. Similarly, under the control of the bit transmitted by the output 622 ($|\alpha_2{}^{q-1}| > |\alpha_1{}^q|$), a second memory 64 addressed by $|\alpha_1{}^q|$ delivers on its output the true value $|\alpha_1{}^q|$ or its twos complement. A binary adder 65 generates the value $|\alpha_2{}^{q-1} - \alpha_1{}^q|$ which represents the amplitude of variation of the phase shift between the start of the scanning line of order (q−1) and the end of said line, this being achieved by measuring the phase shift $\alpha_1{}^q$ of the burst B at the beginning of the line of order q.

A third memory 66 converts said binary word to a load word which is necessary for correct programming of the divider 67.

When $|\alpha_2{}^{\Phi-1}| = |\alpha_1{}^q|$, no interpolation is performed and the gates 680 and 681 in any case remain in the non-conducting state (logical signal "0" on the outputs 620 and 622. The output $S_2$ retains a constant value which is equal to the value of initialization of the counter 68, that is to say which is also equal to the value $\alpha_2{}^{q-1}$ previously attained.

The counter 68 generates at each instant the value of the residual error $\Phi_B$ which relates to the digital interval $|0.512|$ or in other words which represents a phase shift expressed in radians and relating to the interval $|\pi,\pi|$. The elements which are necessary for the actual construction of the computation circuits of FIG. 6 can be chosen from commercially available elements or can be constructed by means of discrete wiring elements. By way of simple illustration, the registers 60 and 61 can be constructed by means of integrated circuits of type 74LS374, the comparator 62 can be of type 74LS85, the adder 65 can be of type 74LS283, the programmable divider 67 can be of type 74LS97 and the counter 68 can be of type 74LS193. These circuits are marketed by the company known as Texas Instruments. The logical gates 630, 680, 681 and 673 can be constructed from elements of integrated circuits, these latter being compatible with the other integrated circuits which have just been mentioned. The memories 63, 64 and 66 can be of the type mentioned earlier.

In the particular example of application which has just been described with reference to FIG. 6, it is difficult to obtain a correction speed which is compatible with the time available for performing this correction by making use of correcting circuits having a configuration illustrated in FIG. 4.

In fact, the number of successive corrections during the time interval T of one scanning line is liable to attain a high value up to 512 in the example considered. It is difficult in particular to construct very-high-speed binary multipliers without having recourse to costly technologies.

Figure 7:
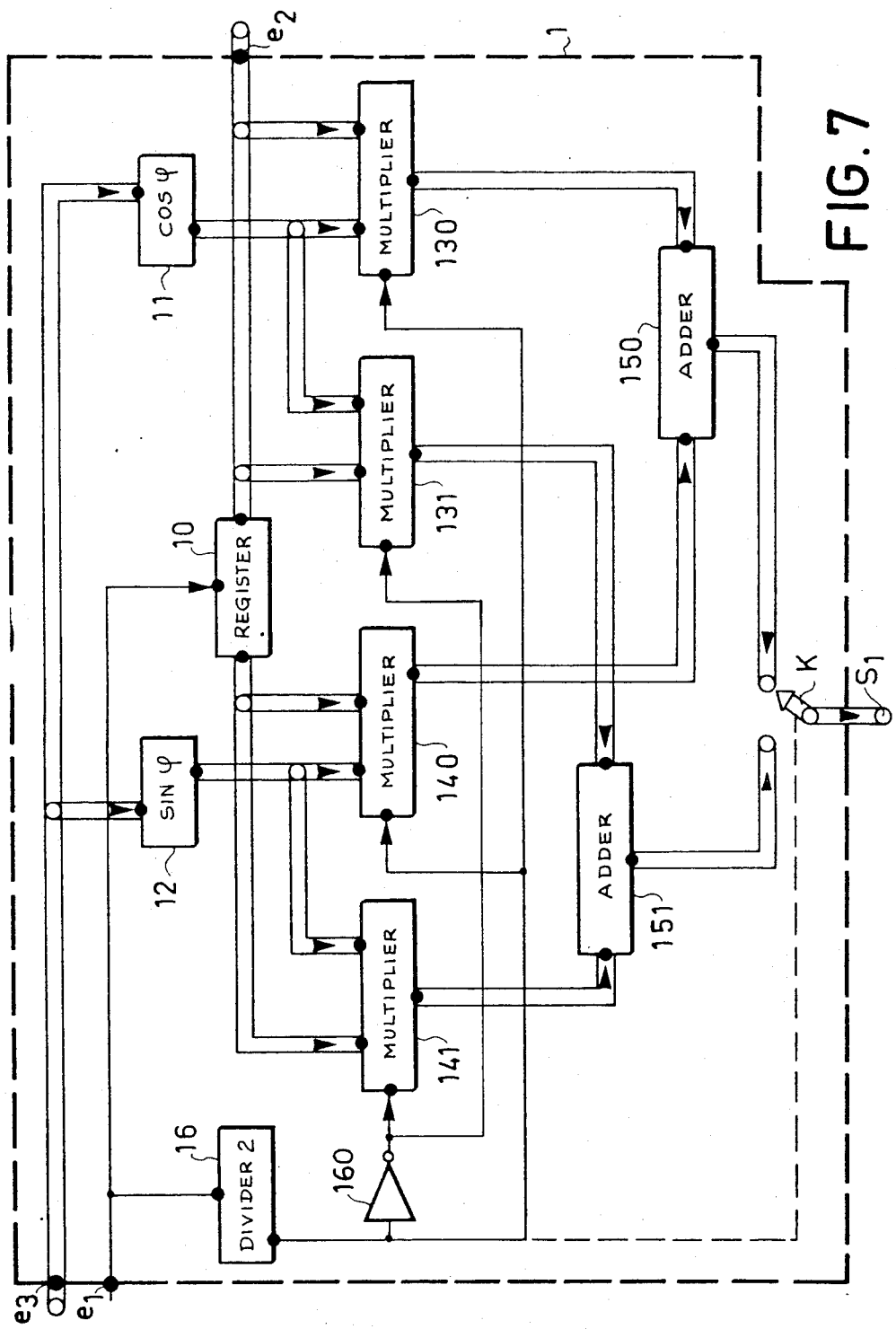
FIG. 7 is a diagram showing a concrete example of construction of the device according to the invention in a particular variant.

FIG. 7 illustrates a concrete alternative embodiment of the correcting circuits 1, this embodiment being particularly suited to the application which has just been described.

In order to perform the multiplication operation, the multipliers 13 and 14 of FIG. 3 are replaced by four multipliers 130 and 131, 140 and 141. The multipliers 130 and 131 on the one hand and the multipliers 140 and 141 on the other hand operate in alternate sequence.

With this objective, a clock signal having a frequency $2F_{sc}$ is obtained by means of a scale-of-two divider 16 from the clock signal ($4F_{sc}$) which is transmitted to the input $e_1$. Said divider can consist of a simple binary counter. In a preferential manner, the signal having a frequency $2F_{sc}$ (and also the signal having a frequency $4F_{sc}$) is a signal having a cyclic ratio equal to 1. Said signal is transmitted directly to a permission input of the multipliers 130 and 140 and is transmitted in inverted form by means of an inverter 160 or in other words phase-shifted by $\pi$ radians to the multipliers 131 and 141.

The adding circuits are also duplicated so as to form the circuits 150 and 151. The output of these adders is transmitted via an electronic switch K to the general output $S_1$ of the correcting circuits 1. Said switch is actuated at the frequency $2F_{sc}$ and can consist, for example, of a logical multiplexer which receives on its clock input the output signal of the divider 16.

The other functions of the correcting circuits as performed by the cos $\Phi$ and sin $\Phi$ generators 11 and 12 and the register 10 as well as the general operation of the correcting circuits are identical with those already described with reference to FIG. 3 and do not need to be recalled.

The invention is not limited to the examples of practical construction which have been described by way of illustration of the device for carrying out the method and is not solely concerned with the application to correction of television signals. The invention is thus applicable to re-synchronization of all digital signals derived from an analog-to-digital conversion and vitiated by a phase error with respect to a predetermined reference value.

What is claimed is:

1. A digital method for correcting the phase error with respect to a predetermined reference value at the time of analog-to-digital conversion of a sine-wave signal having a predetermined frequency F to a sequence of first representative digital signals, said conversion being performed by sampling the analog signal by means of a periodic clock signal having a frequency equal to 4nF, where n is a whole number greater than or equal to 1, wherein said method comprises the following steps:
    measurement of the phase-shift angle between the analog signal and the clock signal and computation of the phase error in respect of each period of said analog signal;
    creation of a second sequence of digital signals by a displacement in time of said first digital signals, said displacement being equal to n periods of the periodic clock signal;
    generation of a digital signal representing the value of the cosine and sine functions of the phase error;
    multiplication of the first and second digital signals by the digital signals representing respectively the values of the cosine and sine functions of said phase error;
    and addition of the results of said multiplications in order to generate a third digital signal, said third signal being equal to the first corrected signal of said phase error.

2. A method according to claim 1, wherein the whole number n is chosen so as to be equal to 1.

3. A method according to claim 1, wherein the digital signals are binary coded words consisting of a plurality of bits transmitted in parallel.

4. A device for the practical application of the method according to claim 3, wherein said device comprises registers having parallel inputs and outputs equal in number to the whole number n and connected in cascade, each register being constituted by a number of bistable elements equal to the number of bits of said binary words derived from the analog-to-digital conversion, said words being transmitted to the inputs of the first register of said cascade of registers, the clock signal being applied to a clock input of said registers for controlling the phase shift of the input binary words at a rate corresponding to the frequency of said signal, first and second means for generating trigonometric functions and receiving on their inputs a binary word representing the value of said phase error and for generating at their outputs respectively binary words representing the corresponding values of the cosine and sine functions, first binary multiplier means having parallel inputs and outputs connected via a first series of inputs to the parallel inputs of the first register of said cascade of registers and via a second series of inputs to the outputs of the first means for generating trigonometric functions, second binary multiplier means having parallel inputs and outputs connected via a first series of inputs to the parallel outputs of the last register of said cascade of registers and via a second series of inputs to the outputs of said second means for generating trigonometric functions, and binary adding means having parallel inputs and outputs which are connected via first and second series of inputs respectively to the outputs of the first and second binary multiplier means and which generate on their outputs a binary word resulting from said addition.

5. A device according to claim 4, wherein the bistable elements of said registers are D-type flip-flops which are actuated at the same rate as the frequency of said clock signal.

6. A device according to claim 4, wherein the first and second means for generating trigonometric functions each comprise a non-volatile programmable read-only memory which receives the binary word representing the phase error on one multiple addressing input and wherein a binary word representing the values of the respective cosine and sine functions of the corresponding phase error is recorded in each addressable memory position.

7. A device according to claim 4, wherein the first and second binary multiplier means are each constituted by two separate multiplier circuits whose respective inputs are connected in parallel and operate alternately at a frequency which is one-half the frequency of said clock signal, the adding means being also constituted by two separate adding circuits, the two series of inputs of the first of these two adding circuits being connected to the first of the two adding circuits respectively of the first and second binary multiplier means and the two series of inputs of the second of said two adding circuits being connected to the second circuits of the two adding circuits respectively of the first and second binary multiplier means, and wherein the outputs of the two adders are connected to multiplexing means actuated at the one-half value of frequency aforesaid.

8. A digital method for correcting the phase error with respect to a predetermined reference value, said error being introduced at the time of analog-to-digital conversion of a signal representing the chrominance component of a composite television signal of the type employed in a simultaneous color television system, said composite signal being constituted by a signal representing said chrominance component which produces amplitude modulation of a high-frequency sine-wave signal designated as a subcarrier to which is added a signal representing luminance information and said conversion being carried out by means of a clock signal having a frequency which is four times that of said subcarrier, the television signal being further divided into time intervals representing scanning lines of a visual display element and constituted at the start of said time intervals by a burst of sine-wave signals having a frequency equal to that of said subcarrier, wherein said method comprises a first stage during which the chrominance component is extracted from the composite signal and a second stage during which said component is corrected in accordance with the method defined in claim 1, the step involving measurement of the phase-shift angle between the analog signal and the clock signal for computing the phase error being such as to take place at each time interval aforesaid throughout the duration of the burst of sine-wave signals and with reference to said signals.

9. A method according to claim 8, wherein the phase error is also computed repetitively throughout the duration of a time interval of one scanning line by interpolation, said interpolation being made by storing the measurement of the phase-shift angle performed during the burst at the beginning of the time interval of a scanning line of a predetermined order ($q-1$) until measurement of the phase-shift angle performed during the time interval of the scanning line of order ($q$), in forming the algebraic difference between these two measurements, in dividing in said difference by a fixed increment in order to divided the time interval of one scanning line into a corresponding number of sub-intervals of equal time-duration, the phase error being incremented or decremented with respect to said increment according to the sign of the algebraic difference at the beginning of each sub-interval aforesaid and wherein the chrominance component is extracted during the time interval of one scanning line of order ($q-1$) and is also stored during said time interval and restituted during the time interval of the scanning line of order ($q$), the phase correction being performed during said time interval.

10. A method according to claim 9, wherein the television system is the PAL system.

11. A method according to claim 9, wherein the television system is the NTSC system.

12. A device for carrying out the method of claim 8, wherein said device comprises a digital filter for extracting the signal representing the chrominance component of said composite television signal and a correction device according to claim 4, said device being connected to the output of said digital filter.

13. A device according to claim 12, wherein said device further comprises first delay means which serve to store the composite television signal during a line-scanning time interval and are connected upstream of said digital filter, second delay means for storing said phase error measurement during the same time-duration and phase computation circuits for receiving the instantaneous phase errors on two series of inputs at the beginning of the time interval of a scanning line, said phase errors being delayed by the same time-duration so as to perform the interpolation aforesaid, said circuits being connected upstream of the error-correcting device.

14. A device according to claim 13, wherein the second delay means comprise shift registers having parallel inputs and outputs.

15. A device according to claim 13, wherein the phase computation circuits comprise first and second registers which have parallel inputs and outputs for recording the instantaneous and delayed values of said phase error and the parallel outputs of which are connected to the inputs of a binary comparator for comparing the two values aforesaid, first means for receiving from the binary comparator a first control signal which indicates whether the instantaneous value of the phase error is smaller than or equal to the delayed value and for generating true binary values or their twos complements of the instantaneous value of the phase error according to the logical state of the first control signal, second means for receiving from the binary comparator a second control signal which indicates whether the instantaneous value of the phase error is higher than the delayed value and for generating the true binary values or their twos complements of the delayed value of the phase error according to the logical state of the second control signal, a binary adder for receiving the output signals of said first and second generating means and forming the absolute value of the difference in the instantaneous and delayed values of the phase error, a programmable divider for generating from a load binary word a uniformly distributed pulse sequence during the time interval of a scanning line, means for loading said programmable divider and for generating the load word from said absolute value, and a binary counter which is initialized at the delayed value of the phase error and receives the pulse sequence on an incrementation input or on a decrementation input according to the respective states of said first and second control signals, the progressive variation of the state of the counter being such as to represent the value computed by interpolation of the phase error at all instants of the time interval of a scanning line.

16. A device according to claim 15, wherein the first and second generating means as well as the loading means of the programmable divider are constituted by non-volatile programmable read-only memories.

* * * * *